United States Patent
Lell et al.

(10) Patent No.: US 9,899,801 B2
(45) Date of Patent: Feb. 20, 2018

(54) SEMICONDUCTOR LASER HAVING IMPROVED INDEX GUIDING

(71) Applicant: OSRAM Opto Semiconductors GmbH, Regensburg (DE)

(72) Inventors: Alfred Lell, Maxhütte-Haidhof (DE); Jens Mueller, Regensburg (DE)

(73) Assignee: OSRAM Opto Semiconductors GmbH (DE)

( * ) Notice: Subject to any disclaimer, the term of this patent is extended or adjusted under 35 U.S.C. 154(b) by 0 days.

(21) Appl. No.: 14/774,416

(22) PCT Filed: Mar. 11, 2014

(86) PCT No.: PCT/EP2014/054736
§ 371 (c)(1),
(2) Date: Sep. 10, 2015

(87) PCT Pub. No.: WO2014/140035
PCT Pub. Date: Sep. 18, 2014

(65) Prior Publication Data
US 2016/0043530 A1 Feb. 11, 2016

(30) Foreign Application Priority Data
Mar. 12, 2013 (DE) .................. 10 2013 204 192

(51) Int. Cl.
*H01S 5/22* (2006.01)
*H01L 21/324* (2006.01)
(Continued)

(52) U.S. Cl.
CPC ............ *H01S 5/22* (2013.01); *H01L 21/3247* (2013.01); *H01S 5/0202* (2013.01); *H01S 5/0425* (2013.01); *H01S 5/204* (2013.01); *H01S 5/32341* (2013.01); *H01S 5/028* (2013.01); *H01S 5/1017* (2013.01);
(Continued)

(58) Field of Classification Search
CPC .... H01S 5/0202; H01S 5/1017; H01S 5/2045; H01S 5/222; H01L 21/3247
See application file for complete search history.

(56) References Cited

U.S. PATENT DOCUMENTS

| 5,574,743 A | 11/1996 | van der Poel et al. |
| 2002/0187579 A1 | 12/2002 | Kubota |

(Continued)

FOREIGN PATENT DOCUMENTS

| JP | 2009-123772 A | 6/2009 |
| JP | 2010-186785 A | 8/2010 |

OTHER PUBLICATIONS

Takada, H., et al., "Ridge-Type Semiconductor Lasers with Antiguiding Cladding Layers for Horizontal Transverse Modes," *IEEE Journal of Quantum Electronics*, vol. 45, No. 8, Aug. 2009, pp. 927-931.

*Primary Examiner* — Tod T Van Roy
(74) *Attorney, Agent, or Firm* — DLA Piper LLP (US)

(57) ABSTRACT

A semiconductor laser includes a main body, a strip having a narrower width provided on the main body, and an active zone that generates light radiation, wherein surfaces of the main body laterally with respect to the strip and side surfaces of the strip are covered with an electrically insulating protective layer, an electrically conductive layer as a contact is provided on a top side of the strip, a cavity is provided between a side surface of the strip and the protective layer at least in a delimited section.

11 Claims, 7 Drawing Sheets

(51) Int. Cl.
  *H01S 5/02* (2006.01)
  *H01S 5/323* (2006.01)
  *H01S 5/042* (2006.01)
  H01S 5/028 (2006.01)
  H01S 5/20 (2006.01)
  H01S 5/10 (2006.01)

(52) U.S. Cl.
  CPC ............ *H01S 5/2045* (2013.01); *H01S 5/222* (2013.01); *H01S 2301/176* (2013.01)

(56) References Cited

U.S. PATENT DOCUMENTS

| | | |
|---|---|---|
| 2007/0121691 A1 | 5/2007 | Sugiyama et al. |
| 2007/0217461 A1 | 9/2007 | Masui |
| 2012/0058585 A1 | 3/2012 | Maegawa et al. |

SEMICONDUCTOR LASER HAVING IMPROVED INDEX GUIDING

TECHNICAL FIELD

This disclosure relates to a semiconductor laser and a method of producing a semiconductor laser.

This patent application claims the priority of German Patent Application 10 2013 204 192.6, the disclosure content of which is hereby incorporated by reference.

BACKGROUND

Semiconductor lasers having a so-called "ridge structure" are known. In that case, the semiconductor laser has a main body on which a strip having a reduced width is formed. The active zone that generates light radiation is arranged in the main body. Improved guiding of the light radiation along the longitudinal extent of the strip is achieved as a result of formation of the strip having a reduced width. The strip is covered with a passivation layer consisting of silicon oxide, for example, and has an optical refractive index of 1.48. Those index-guided semiconductor lasers exhibit guidance of the light radiation that is all the better, the larger the jump in the optical refractive index from the material of the strip to the material of the passivation layer.

There is nonetheless a need to provide a semiconductor laser having better guiding of the light beams.

SUMMARY

We provide a semiconductor laser including a main body, a strip having a narrower width provided on the main body, and an active zone that generates light radiation, wherein surfaces of the main body laterally with respect to the strip and side surfaces of the strip are covered with an electrically insulating protective layer, an electrically conductive layer as a contact is provided on a top side of the strip, a cavity is provided between a side surface of the strip and the protective layer at least in a delimited section.

We further provide a method of producing a semiconductor laser including an active zone that generates light radiation and a main body including providing a strip having a narrower width on the main body, providing side surfaces of the strip with an electrically insulating protective layer, forming a cavity between a side surface of the strip and the protective layer and, applying an electrically conductive layer to the top side of the strip.

We yet further provide a method of producing a semiconductor laser including an active zone that generates light radiation and a main body, including providing a strip having a narrower width on the main body, providing side surfaces of the strip with an electrically insulating protective layer, forming a cavity between a side surface of the strip and the protective layer, applying an electrically conductive layer to the top side of the strip, covering a top side of the strip with a sacrificial layer, providing the sacrificial layer and side surfaces of the strip with the electrically insulating protective layer, wherein the sacrificial layer and the protective layer have different coefficients of thermal expansion which differ by a factor of 2, during a subsequent heating process, on account of the different coefficients of thermal expansion, forming a cavity between the side surface of the strip and the protective layer, removing the protective layer and the sacrificial layer from the top side of the strip, and subsequently applying the electrically conductive layer on the top side of the strip.

LIST OF REFERENCE SIGNS

Figure 1:
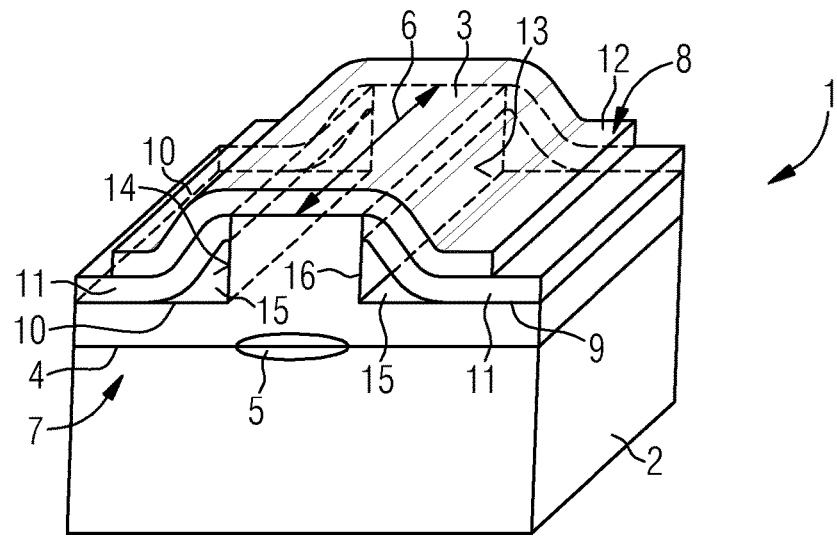
FIG. 1 shows a schematic illustration of a first example of the semiconductor laser.

1 Laser diode
2 Main body
3 Strip
4 Zone
5 Optical mode
6 Longitudinal direction
7 First end face
8 Second end face
9 First surface of the main body
10 Second surface of the main body
11 Protective layer
12 Conductive layer
13 First side surface
14 Second side surface
15 Cavity
16 Corner region
17 Gap
18 Cutout
19 Sacrificial layer
20 Upper part
21 Etching mask
22 Spacer layer
23 $2^{nd}$ gap
24 $2^{nd}$ conductive layer
25 Further layer

DETAILED DESCRIPTION

Our semiconductor lasers have the advantage that very efficient guidance of the light radiation along the strip is achieved even in a material for the strip which has a low refractive index.

This advantage is achieved by the fact that a cavity is present laterally with respect to the strip at least in a delimited section. A large difference in refractive index between the strip and the cavity is realized by virtue of the cavity. Efficient index guiding of the light radiation is achieved as a result.

The cavity can be in the form of a single cavity, a plurality of cavities or a cavity structure, e.g., as porous material. What is essential is a reduction of the density of the material of the protective layer such that an effective refractive index that is reduced compared to the material of the protective layer is present in a region adjoining the strip.

Consequently, one basic concept consists of forming the protective layer laterally adjoining the strip such that cavities are present in the protective layer and in particular adjoining the surface of the strip. Consequently, the light radiation is shielded from the highly absorbent metallization of the contact by the non-absorbent cavity and the non-absorbent dielectric protective layer. The arrangement described is simple and cost-effective to produce. In particular, the arrangement described is suitable for materials having a low optical refractive index such as, e.g., nitride-based semiconductor lasers having an optical refractive index in the region of 2.5.

The active zone may be arranged at least partly in the strip above the main body. In this example, too, the cavity adjoining the strip affords improved currents of the light waves as a result of the increased jump in refractive index in the transition from the strip to the cavity. By way of example, at least one part of the side surface of the active zone adjoins the cavity. Preferably, the opposite side surfaces of the active zone in each case completely adjoin a cavity. The larger the overlap between the cavity and the side surface of the active zone, the better the optical guidance of the light radiation through the strip.

The active zone may be arranged in the main body. In this example, too, the cavity adjoining the strip and/or adjoining the surface of the main body in the region of the strip affords improved guidance of the light waves as a result of the increased jump in refractive index. Consequently, it is not necessary for the strip to be worked from the semiconductor material of the main body as far as near the active zone, in particular near the electron barrier. As a result, in particular, the risk of crystal damage and the production of non-radiative recombination centers are suppressed, in particular avoided. The efficiency of the laser is thus ensured.

The cavity may be arranged in a manner adjoining a transition between a surface of the main body and a side surface of the strip, i.e., adjoining a corner region. As a result, the cavity is arranged very near the active zone and thus brings about very efficient index guiding of the light radiation.

The cavity may extend over an entire side length of the strip. As a result, efficient index guiding of the light radiation is achieved along the entire length of the strip.

Depending on the chosen structure, the form of the cavity can vary along the length of the strip, in particular, the cavity can be provided only in sections. Preferably, the cavity has a substantially constant cross section along the strip.

The cavity may extend over an entire height of the side surface of the strip. In this example, the protective layer is at a lateral distance from the side wall of the strip. A gap between the side wall and the protective layer in the upper region of the strip is covered by the electrical contact. Improved guidance of the light radiation is achieved when the cavity is formed over the entire height of the side surface. Moreover, the cavity is reliably closed by the electrical contact. The stability of the semiconductor material of the strip is thus ensured.

In a corner region between a side surface of the strip and a surface of the main body a cutout may be introduced into the surface of the main body, the cutout forming at least one part of the cavity. The cutout extends at least in sections along the strip. As a result of formation of the cutout, the cavity is arranged even nearer the active zone and the electron barrier. A further improvement in the index guiding is thus achieved.

Depending on the chosen structure, the cutout can have a depth of 2 to 100 nm, for example. Moreover, the cutout can be produced, for example, by an etching method, in particular a dry etching method. The parameters described ensure that production of the cutout is simple and improved index guiding of the light radiation is achieved without the crystal structure of the semiconductor layers of the laser being impaired too much.

The cavity may have a height of 5 to 100% of the height of the side surface of the strip. Even in this range, positive influences on the guidance of the light radiation are obtained.

The cavity may have a width as viewed perpendicular to the side surface of the strip, which is, for example, of 2 to 500 nm, preferably 300 nm. Even with these widths, improved index guiding of the light radiation is achieved. In principle, however, the index guiding through the cavity is all the better, the wider and higher the cavity is made.

The semiconductor laser has cavities on both sides of the strip, for example, which cavities are substantially identical.

The method described affords the advantage that formation of the cavity can be carried out simply and cost-effectively. As a result of the use of a sacrificial layer and a protective layer consisting of materials whose coefficients of thermal expansion are different, in particular differ by a factor of 2 to 20, the cavity may be produced dependably and reliably with the aid of the thermal baking process.

The side surfaces of the strip may be provided with a sacrificial layer, wherein an electrically insulating protective layer is applied to the sacrificial layer, the sacrificial layer is subsequently removed, and the electrically conductive layer is applied to the strip. A further method by which the cavities can be produced simply and reliably is provided as a result.

Between the side surface and the protective layer and/or between the surface of the main body and the protective layer an intermediate layer may be provided at least in sections, in particular in the region of a facet, wherein the intermediate layer is formed such that upon cleavage of a facet in the facet region the intermediate layer and thus the protective layer are detached at least partly from the side surface and/or from the surface of the main body, as a result of which a cavity is formed. The production of the cavity can thus be simplified.

The above-described properties, features and advantages and also the way in which they are achieved will become clearer and more clearly understood in association with the following description of the examples which are explained in greater detail in association with the drawings.

We provide semiconductor lasers, in particular nitride-based lasers used, for example, in projection systems having a light power of 1,000 to 1,000,000 lm. A high-efficiency, index-guided laser diode, in particular an In—GaN laser diode, is required for the high light power. The index guiding is achieved by the fact that in the region of the strip (ridge) there is a large jump in the optical refractive index between the strip and the surrounding layer, in particular the protective layer. The protective layer constitutes a passivation and is produced from an optically low refractive index dielectric and is arranged on both sides of the strip. Depending on the chosen structure, other materials such as, e.g., gallium arsenide laser diodes can be used. In nitride-based laser diodes, however, use of the cavity is of particular importance since the refractive index of the nitride-based laser diodes is only in the region of 2.5. Consequently, for index guiding that is as efficient as possible it is particularly advantageous that a cavity adjoins the strip. The known dielectric layers are generally used as a passivation layer, i.e., protective layer consisting of silicon oxide ($SiO_2$) having an optical refractive index of approximately 1.48, aluminium oxide ($Al_2O_3$) having a refractive index of approximately 1.7, and silicon nitride ($Si_3N_4$) having a refractive index of approximately 2.05. Better protective views which are not light-absorbent and have a lower refractive index than silicon oxide are not available. Consequently, formation of a cavity adjoining the surfaces of the strip and in the corner region with respect to the main body of the laser constitutes a significant improvement in the guidance of the light radiation along the strip.

FIG. 1 shows in a schematic illustration one example of a semiconductor laser in the form of a laser diode 1 constructed from layers of semiconductor material and has a main body 2, on the top side of which a narrower strip 3 is arranged. The narrow strip 3 is worked from the semiconductor layers of the main body 2 by a dry etch, for example. Semiconducting layers are arranged both in the strip 3 and in the main body 2. The strip 3 constitutes a ridge composed of a semiconductor material, in particular layers of semiconducting material. A pn junction with an active zone 4 is formed in the main body 2. Below the strip 3, an optical mode 5 in the form of an oval is illustrated schematically in the region of the active zone 4, which generates the light radiation. Formation of the optical mode 5 of the light radiation depends on the optical guiding of the light radiation. The light radiation generated by the active zone 4 is guided by corresponding light guiding layers along the longitudinal direction 6 of the strip 3 in the laser diode. Mirror layers (not illustrated) are provided at opposite end faces, the facets, which mirror layers result in a reflection of the light radiation, wherein a mirror layer is at least partly transmissive to couple out the light generated by the active zone 4 from the semiconductor laser.

The arrangement of the stepping of the strip 3, i.e., of the corner region, near the active zone 4 is advantageous for efficient guidance of the light radiation generated, i.e., for formation of a narrowly delimited optical mode 5. Therefore, a distance between the active zone 4 and a lateral surface 9, 10 should be as small as possible. Side surfaces 13, 14 of the strip 3 and the first and second surfaces 9, 10 of the main body 2 are covered by a protective layer 11 constituting a dielectric passivation layer. An electrically conductive layer 12 is applied on a top side of the strip 3 and the protective layer 11 and constitutes an electrical contact with the strip 3. A cavity 15 is in each case formed between the protective layer 11 and a side surface 13, 14 of the strip 3 and/or a surface 9, 10 of the main body 2. In the example illustrated, in the corner region 16 arranged between the side surface 13, 14 of the strip 3 and the corresponding surface 9, 10 of the main body, the cavity 15 adjoins both the side surface 13, 14 and the adjoining surface 9, 10 of the main body 2. Depending on the chosen structure, the cavity 15 can also adjoin only the first or second surface of the main body 9, 10 or the first and/or the second side surface 13, 14 of the strip 3. The cavity 15 can also be provided only in sections along one or along two longitudinal sides of the strip 3.

Furthermore, the cavity 15 can also be formed by a protective layer 11 having a plurality of cavities, in particular is porous and/or fissured. Any type of material cutout in the corner region 16 results in an improvement in the guidance of the light radiation, in particular in a delimited optical mode 5 arranged in the main body 2. The less material of the protective layer 11 is provided in the corner region 16, the smaller the refractive index and the larger the actual jump—perceived by the light radiation—in the refractive index adjoining the side surface 13, 14 of the strip 3 and/or adjoining the surface 9, 10 of the main body 2.

Formation of a complete cavity 15, as illustrated in FIG. 1, increases the jump in the refractive index from the refractive index of the material of the main body or of the strip 3 to the refractive index 1 for air. As a result, efficient mode guiding is achieved even in an increased distance between the corner region 16 and the active zone 4. The increased distance of the corner region 16 results in reduced instances of damage being caused such as, for example, recombination centers, scattering centers and absorption centers in the active zone 4 and the region of the light wave guiding of the semiconductor layer. Consequently, the optical efficiency of the laser diode is increased and long-term stability is additionally improved. As a result of formation of the cavity 15, a greater lateral light wave guidance is achieved even in an increased distance between the corner region 16 and the active zone 4. This results in an improved performance, in particular in a reduced threshold current and an increased aging stability. Moreover, the yield is improved during the production of the laser diodes on account of the increased manufacturing tolerance. Furthermore, multimode operation is possible even in a narrower strip 3. Furthermore, the reduced optical loading of the mirror layers (facets) of the first or second end face 7, 8 occurs. In addition, an increased gain is achieved for a defined width of the strip 3.

The cavity 15 in FIG. 1 does not reach as far as the top side of the strip 3, but rather ends below the top side of the strip in a manner spaced apart by the thickness of the protective layer 11. In this example, the protective layer 11 is led as far as the side surface 13, 14 of the strip 3. The cavity 15 is thus closed off laterally by the protective layer 11. On the first and/or second end face 7, 8, the cavity 15 is closed by the dielectric mirror layers (not illustrated).

Figure 2:
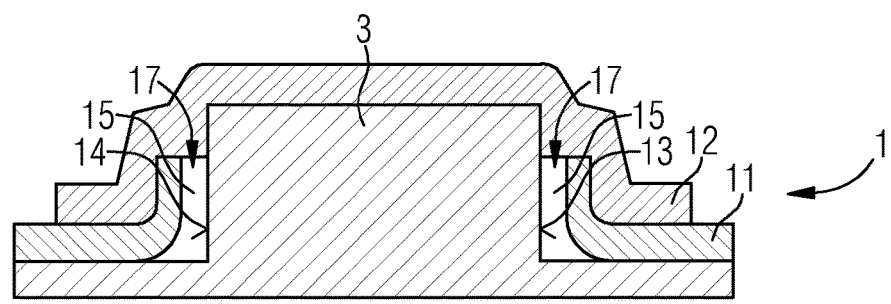
FIG. 2 shows a schematic cross section through a second example of the semiconductor laser.

FIG. 2 shows a further example of the laser diode 1, wherein, in this example, the cavity 15 is closed toward the top by the electrically conductive layer 12. The protective layer 11 is at a distance from the side surfaces 13, 14 of the strip 3 and an upwardly open gap 17 is formed. The gap 17 is by the electrically conductive layer 12, which is formed, for example, as a metal layer.

Figure 3:
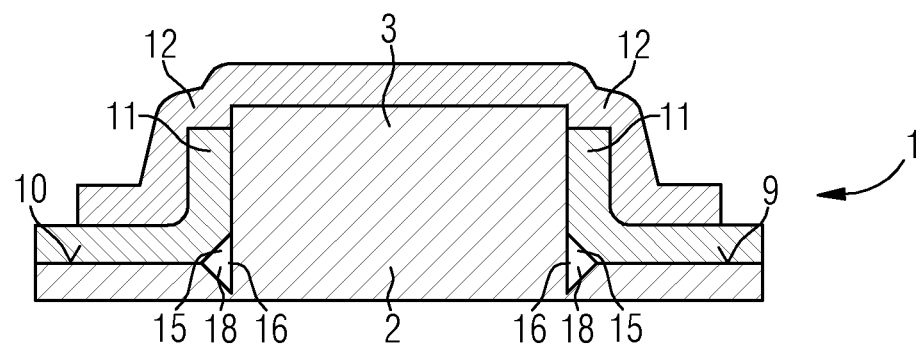
FIG. 3 shows a schematic cross section through a third example of the semiconductor laser.

FIG. 3 shows a further example of the laser diode 1, wherein, in this example, the cavity 15 is formed substantially only in the corner region 16 between the side surface 13, 14 of the strip 3 and the corresponding surface 9, 10 of the main body 2. The cavity 15 can be formed exclusively by a cutout 18 in the surface 9, 10 of the main body adjoining the corner region 16. The cutout 18 can have a depth of 2 to 100 nm, for example. Correspondingly, the cutout 18 can also have a corresponding width as viewed perpendicularly to the side surface 13, 14 of the strip 3. The cutout 18 extends, for example, in sections or along the entire length of the strip 3. The cutout 18 can be introduced into the surfaces 9, 10 of the main body 2 with the aid of an etching method, in particular with the aid of a dry etching method. The protective layer 11 bears against the side surfaces 13, 14 of the strip 3 substantially over the entire height of the side surfaces 13, 14.

Depending on the chosen structure, the cavity 15 can have a height of 5% to 100% of the height of the side surface 13, 14 of the strip 3. Moreover, the cavity 15 can have a width of 2 nm to 500 nm, preferably 300 nm, in a direction perpendicular to the side surface 13, 14 of the strip 3. Depending on the chosen structure, the cross section of the cavity can vary in terms of width and/or in terms of height along the strip 3.

Figure 4:
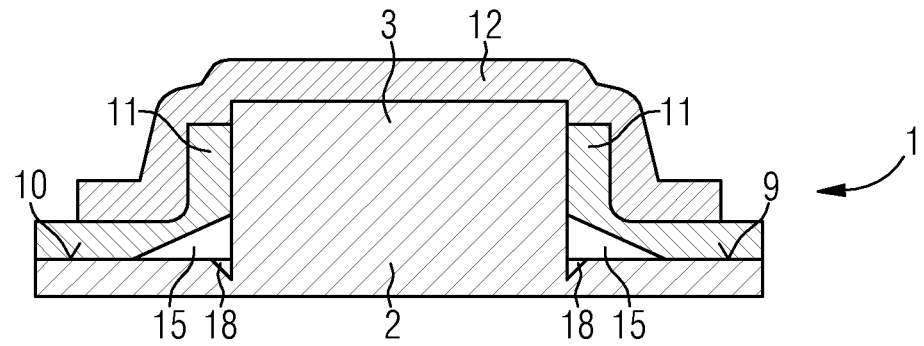
FIG. 4 shows a schematic cross section through a fourth example of the semiconductor laser.

FIG. 4 shows an example of the laser diode 1 in which a cutout 18 is introduced into the surfaces 9, 10 of the main body 2 adjoining the corner region 16. Moreover, a cavity 15 is provided between the protective layer 11 and the corresponding side surfaces 13, 14 of the strip 3 and the corresponding surfaces 9, 10 of the main body 2. The cavity 15 has a width perpendicular to the strip 3 which is greater than the height of the cavity parallel to the side surface 13, 14 of the strip 3.

In a further example, the cavity 15 illustrated in FIGS. 1 to 4 and 18 can also be filled at least partly or completely with a porous protective layer 11. For this purpose, in the simplest case, a porous protective layer 11 is deposited at least in a manner adjoining the side surfaces of the strip 3 and onto the surface of the main body 2 adjoining the strip 3. Depending on the chosen structure, a normal protective layer 11 can be deposited onto the porous protective layer 11.

Depending on the chosen structure, the forms and arrangements of the cavities 15 and examples of the protective layer 11 and of the cutouts 18 as illustrated in FIGS. 1 to 4 can be combined with one another. The design explained with reference to FIGS. 1 to 4 has the advantage that improved index guiding is achieved by a large jump in refractive index. Moreover, a high device efficiency and an increased stability of the laser diode are achieved as a result of a high etching distance between the corner region 16 and the active zone 4 and a high process yield for the production of the laser diodes is made possible as a result. Furthermore, the lasers have improved parameters such as, e.g., a reduced threshold current and an increased device stability.

Figure 5:
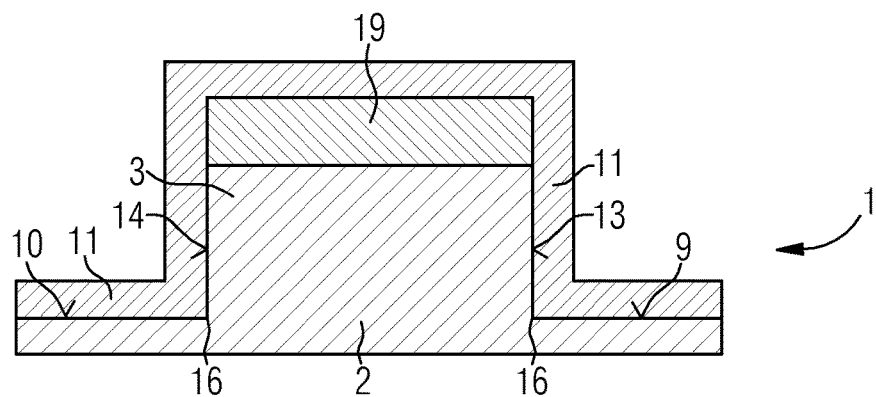
FIGS. 5 to 9 show method steps of a first method of producing a semiconductor laser.

FIGS. 5 to 9 show method steps of a first method of producing a semiconductor laser comprising a cavity adjoining the corner region of the ridge. FIG. 5 shows a semiconductor laser in the form of a laser diode 1 comprising a main body 2, from the top side of which a strip 3 was structured above the zone 4 by an etching method. The strip 3 constitutes an elongate ridge. A sacrificial layer 19 is applied on a top side of the strip 3. The sacrificial layer 19 is covered with a passivation in the form of a protective layer 11. Moreover, the protective layer 11 also covers side surfaces 13, 14 of the strip 3 and surfaces 9, 10 of the main body 2 which are formed laterally with respect to the strip 3.

The protective layer 11 was deposited by a CVD method, for example. The sacrificial layer 19 can be, for example, silicon oxide. The protective layer 11 can be, for example, silicon nitride, zirconium oxide, titanium oxide, titanium nitride or tantalum nitride. The choice of the sacrificial layer 19 and the choice of the protective layer 11 are defined by the fact that the coefficients of thermal expansion of the sacrificial layer 19 and of the protective layer 11 are intended to differ at least by a factor of 2 or greater, for example, by a factor of 10 or 20 or greater. Silicon oxide ($SiO_2$) has a coefficient of thermal expansion of $4.5 \times 10^{-7}$ per kelvin. Zirconium oxide ($ZrO_2$) has a coefficient of thermal expansion of $100 \times 10^{-7}$ per kelvin. Titanium oxide ($TiO_2$) has a coefficient of thermal expansion of $90 \times 10^{-7}$ per kelvin. Titanium nitride (TiN) has a coefficient of thermal expansion of $94 \times 10^{-7}$ per kelvin. Tantalum nitride (TaN) has a coefficient of thermal expansion of $44 \times 10^{-7}$ per kelvin. Consequently, when silicon oxide is used as the sacrificial layer, the stated materials are suitable for the example of the protective layer 11. The protective layer 11 can have a thickness of 30 nm to 1 μm. The sacrificial layer 19 can have a thickness of 30 nm to 2 μm. The arrangement in FIG. 5 is subjected to a thermal heating process, wherein the arrangement is heated to a temperature of more than 200° C., for example. The time duration for the heating can be in the range of 3 seconds to 30 minutes. The arrangement is subsequently cooled.

Figure 6:
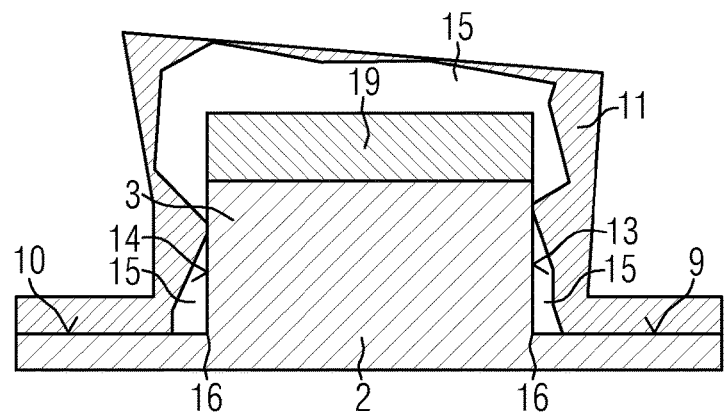

FIG. 6 shows the arrangement after the heating process and after cooling. On account of the differences in the coefficients of thermal expansion between the semiconductor material of the semiconductor laser, i.e., of the strip 3, the protective layer 11 and the sacrificial layer 19, cavities 15 are formed between the strip 3 and the protective layer 11 and between the sacrificial layer 19 and the protective layer 11. In particular, the cavities 15 adjoin corner regions 16 of the strip 3.

Figure 7:
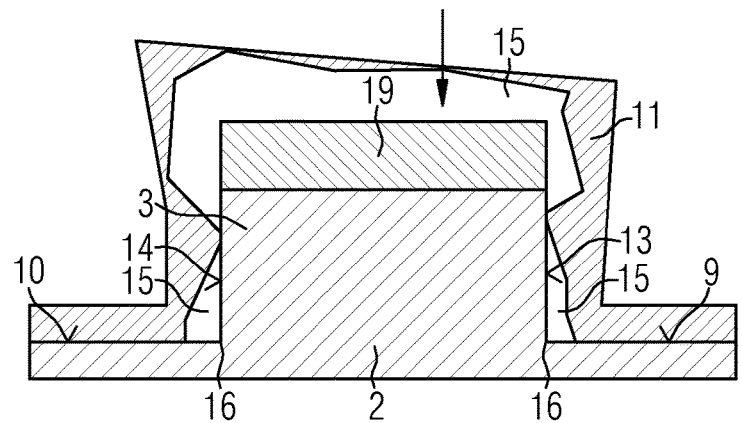
Figure 8:
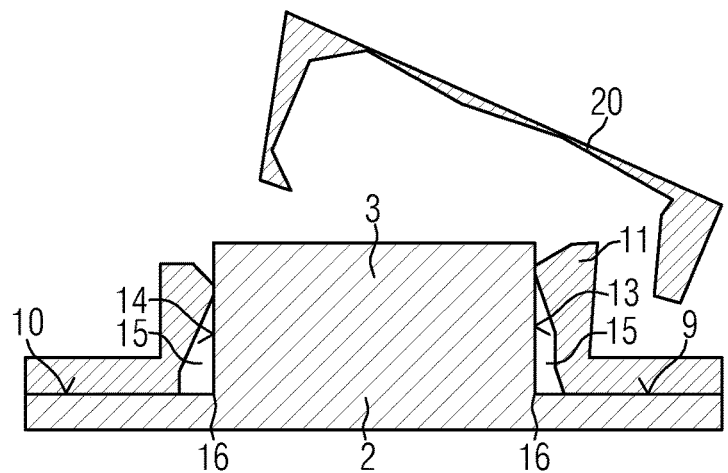

Afterward, as illustrated in FIG. 7, a wet-chemical etching step is carried out, in which the etching liquid penetrates in particular into the cavities 15 above the sacrificial layer 19 (arrows) and dissolves the sacrificial layer 19.

Figure 9:
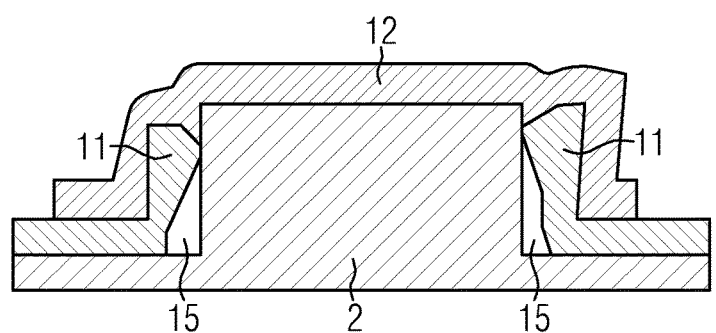

A wet etching process is then carried out in which both the sacrificial layer 19 and an upper part 20 of the protective layer 11 are removed with mechanical assistance or by a wet-chemical high-pressure process. This method state is illustrated schematically in FIG. 8. Afterward, the conductive layer 12 is applied to the top side of the strip 3 and to adjoining regions of the protective layer 11, as illustrated in FIG. 9. The conductive layer 12 constitutes, for example, a p-type contact for the laser diode 1.

Figure 10:
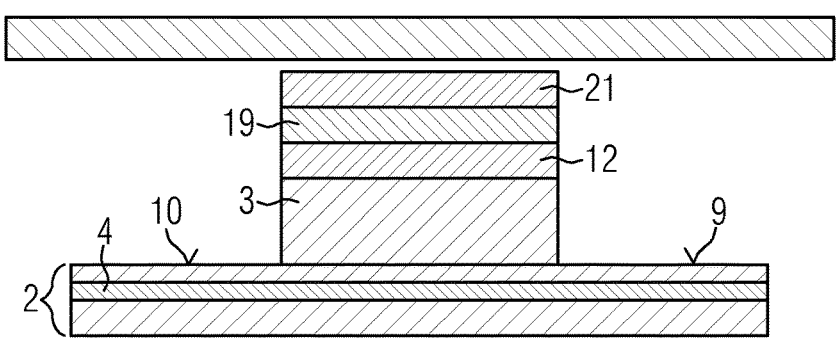
FIGS. 10 to 17 show method steps of a further method of producing the semiconductor laser.

FIGS. 10 to 17 schematically describe method steps of a further method of producing a semiconductor laser comprising a cavity adjoining the strip (ridge) of the semiconductor laser. FIG. 10 shows a cross section through a layer construction comprising a main body 2 comprising a sequence of semiconducting layers which have a pn junction with an active zone 4. The active zone 4 generates light radiation. A strip 3 is formed on the main body 2, the strip likewise having semiconductor layers. A conductive layer 12 is arranged on the strip 3. A sacrificial layer 19 is arranged on the conductive layer 12. An etching mask 21 is formed on the sacrificial layer 19. FIG. 10 shows the arrangement after the semiconducting layers in the region of the strip 3, the electrically conductive layer 12 and the sacrificial layer 19 were structured with the aid of etching methods with the aid of the etching mask 21. A spacer layer 22 is subsequently deposited onto the free surfaces. The deposition is carried out with the aid of an isotropic method such as, e.g., with the aid of ALD or CVD or TEOS. Layers appropriate as spacer layers include those which can be wet-chemically etched selectively with respect to the other layers, i.e., whose etching damages neither the contact metal nor the passivation nor the semiconductor. Depending on passivation and contact metal, the following are appropriate for the spacer layer: organic layers (e.g., photo resist), dielectrics (oxides or nitrides of Si, Ti, Ta, Al, Nb, Zn, Zr, e.g., $TiO_2$, $SiO_2$, $Si_3N_4$, $Al_2O_3$, $Ta_2O_5$, . . . ), metals (e.g., Pd, Al, Au, Ni, Pt, Ti, Cr, . . . ) or combinations thereof (e.g., silicon oxynitride) or else multilayer systems ($Ti/SiO_2$).

Figure 11:
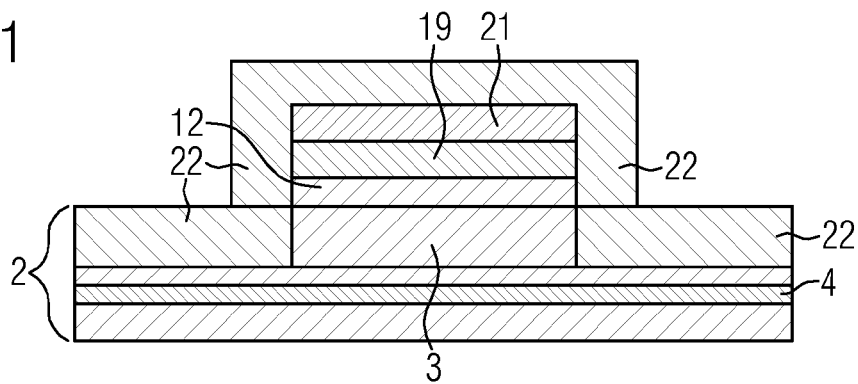
Figure 12:
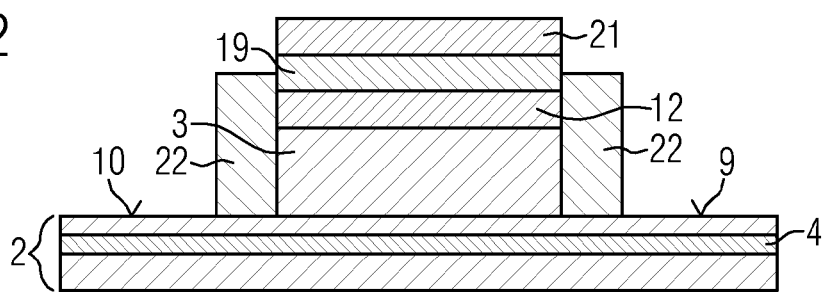

This method state is illustrated in FIG. 11. Afterward, by an anisotropic etch, the spacer layer 22 in the region above the etching mask 21 and laterally with respect to the sacrificial layer 19 and at a distance from the strip 3 is removed from a first and second surface 9, 10 of the main body 2, as is illustrated in FIG. 12. Consequently, the spacer layer 22 remains arranged on the side surfaces 13, 14 of the strip 3 and still laterally covers the conductive layer 12 and partly the sacrificial layer 19. The spacer layer constitutes a second sacrificial layer.

Figure 13:
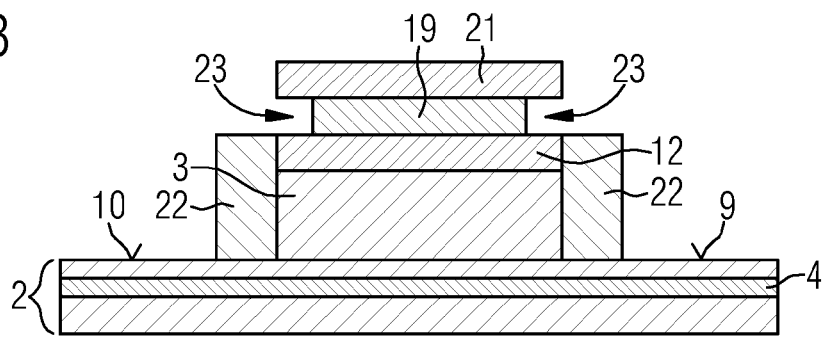

Afterward, in a wet-chemical etching process, a lateral part of the sacrificial layer 19 and an upper part of the spacer layer 22 are removed as far as the conductive layer 12, as illustrated in FIG. 13. As a result, the etching mask 21 is undercut laterally along the strip 3 in the form of two second gaps 23 extending over the length of the strip 3.

Figure 14:
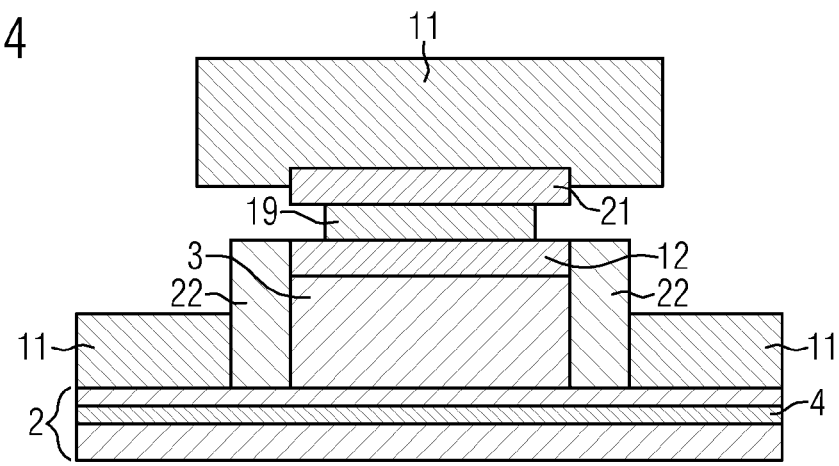
Figure 15:
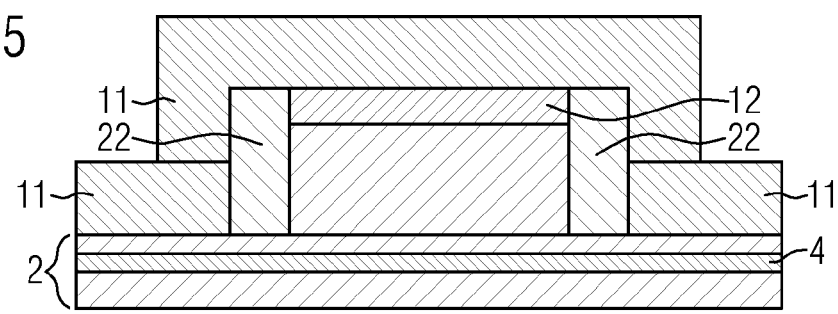

In a subsequent method step, a protective layer 11 is deposited onto the arrangement. Owing to the undercut sacrificial layer 19, the second gap 23 between the protective layer 11 and the sacrificial layer 19 remains free. This method state is illustrated in FIG. 14. The second gaps 23 run along the longitudinal extent on both sides of the strip 3. In a subsequent method step, the sacrificial layer 19 and the etching mask 21 situated thereabove and the protective layer 11 are removed with the aid of a lift-off technique. Moreover, an additional protective layer 11 is deposited onto the conductive layer 12 and upper free sections of the spacer layer 22. This method state is illustrated in FIG. 15.

Figure 16:
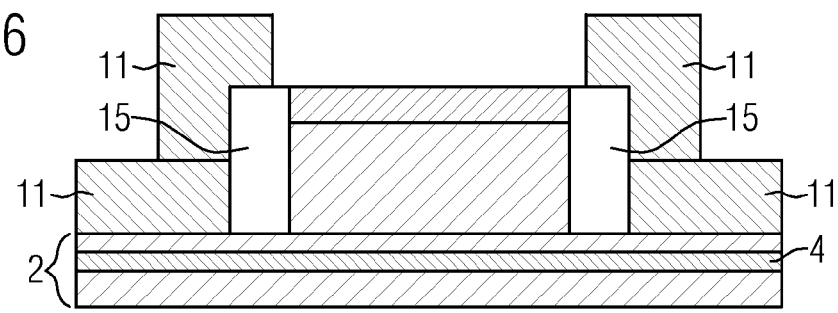
Figure 17:
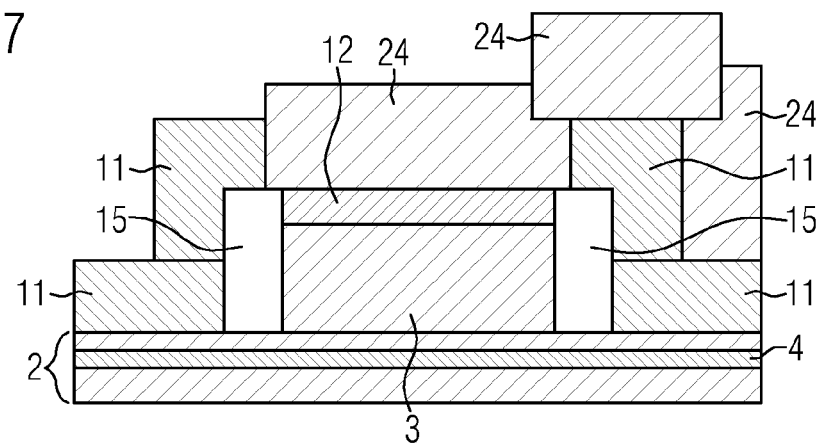

In a subsequent method step, the additional layer 11 in the region of the conductive layer 12 and laterally adjoining in the region of the spacer layer 22 is removed with the aid of an etching method. The spacer layer 22 is then removed, for example, with the aid of a wet-chemical etching method. This method state is illustrated in FIG. 16. Afterward, a second conductive layer 24 is applied to the exposed conductive layer 11. In addition, the main body 2, illustrated in a manner not true to scale in terms of thickness, is thinned from the underside, i.e., from the end side. An n-type contact is subsequently applied. Laser facets are then cleaved. Mirror layers are subsequently applied to the opposite laser facets. Afterward, the bars are singulated into individual laser diodes. The laser diodes are subsequently mounted in a corresponding housing. A cavity 15 is obtained as a result of the removal of the spacer layer, the cavity not being filled when the second conductive layer 24 is applied. Consequently, the opposite side surfaces 13, 14 of the strip 3 are spaced apart from the protective layer 11 in each case laterally by a cavity 15, as illustrated in FIG. 17.

Depending on the chosen structure, formation of the cavity 15 can also be limited to facet regions, i.e., end regions of the strip 3. Formation of the cavity 15 in the facet region enables reduced heating of the laser facet, i.e., of the mirror layers. As a result, it is possible to achieve a higher light power without damaging the mirror layers. Moreover, formation of the cavity 15 in the region of the laser facet has the advantage that a lower strain of the semiconductor materials is present. As a result laser facets can be cleaved more easily and better. As a consequence thereof, a higher facet quality is achieved. Consequently, mirror losses are reduced. Improved laser parameters and an improved device part stability are thus obtained.

Formation of the cavity in the region of the laser facet can be in accordance with the method described in FIGS. 10 to 17, wherein formation of the spacer layer 22 is delimited to the face regions. In a further example, for the purpose of producing a cavity 15 into facet regions before application of the protective layer 11, an adhesion-reducing further layer 25 can be applied to the surfaces 9, 10 of the main body 2 and/or to the side surfaces 13, 14 of the strip 3. The adhesion-reducing layer 25 is such that the forces occurring during the cleavage of the laser facet lead to a locally delimited lift-off of the protective layer 11 from the first and respectively second surfaces 9, 10 of the main body 2 and/or to a locally delimited lift-off of the protective layer 11 from the first and respectively second side surfaces 13, 14 of the strip 3. Consequently, cavities 15 spatially delimited to the facet regions are produced in this way (FIG. 18, FIG. 19).

Figure 18:
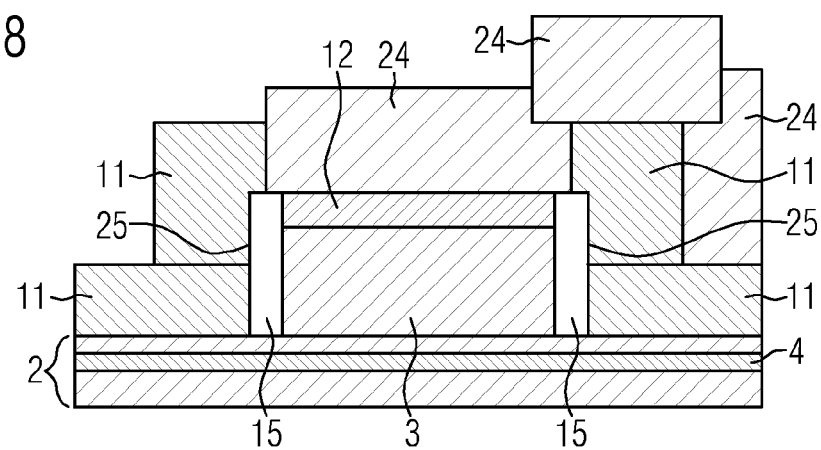
FIG. 18 shows a schematic cross section through a further example of the semiconductor laser.

FIG. 18 shows in a schematic illustration a cross section through a facet region of a semiconductor laser 1, wherein a cavity 15 is formed in a locally delimited fashion in the facet region. The arrangements in accordance with FIG. 18 can be produced by a method in accordance with FIGS. 10 to 17.

In a further example, a further layer 25 can be laterally applied to the side surfaces 13, 14 of the strip 3. The further layer 25 constitutes an adhesion-reducing layer that is detached from the first and respectively second side surfaces 13, 14 of the strip 3 during the cleavage of the laser facets. Thus, the protective layer 11 is detached from the side surfaces 13, 14 during the cleavage of the laser facet and a cavity 15 is formed. The further layer 25 is spatially delimited to the facet regions in the longitudinal direction of the semiconductor laser. Moreover, the expansion of the further layer 25 is delimited, for example, to the height of the strip 3.

Figure 19:
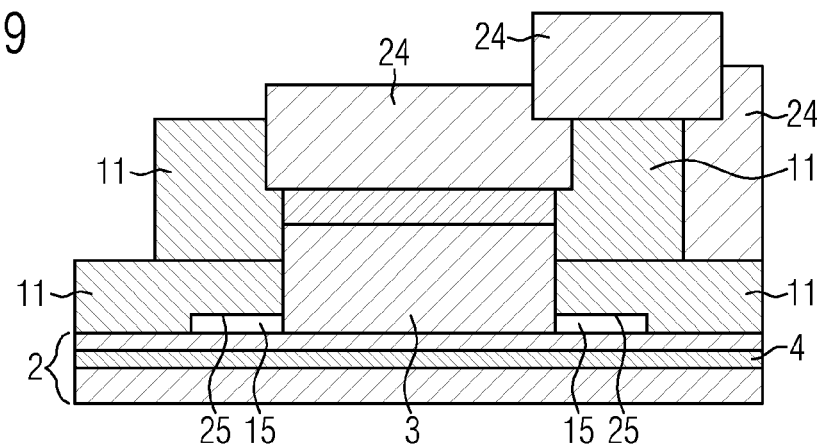
FIG. 19 shows a schematic cross section through a further example of the semiconductor laser.

FIG. 19 shows a further example with a cross section of a semiconductor laser in the facet region, wherein a cavity 15 is formed in a spatially delimited fashion in the facet region, which cavity was achieved by the lift-off of a further layer 25. The further layer 25 was applied to the surfaces 9, 10 of the main body 2 before the application of the protective layer 11. The further layer 25 constitutes an adhesion-reducing layer detached from the first and respectively second surfaces 9, 10 of the main body 2 during cleavage of the laser facets. Thus, the protective layer 11 in the region of the further layer 25 is also detached from the surface 9, 10 and a cavity 15 is formed. The further layer 25 is spatially delimited to the facet regions in the longitudinal direction of the semiconductor laser. Moreover, the lateral expansion of the further layer 25 is delimited to 2 nm to 100 nm.

The arrangements in accordance with FIGS. 18 and 19 were produced, for example, by a method in accordance with FIGS. 10 to 17, wherein the further layer 25 was additionally applied.

The following are appropriate as adhesion-reducing layer 25, for example: thin organic layers (e.g., phenols, photoresist, . . . ), oxidized semiconductor surfaces (e.g., oxidized AlGaN, AlInGaN or InGaN or GaN surface) or porous semiconductor surfaces produced by dry etching damage. Alternatively, combinations of these layers or other layers are also appropriate as adhesion-reducing layers.

The adhesion-reducing layer can be applied in a targeted manner in the facet region of the coupling-out facet of the semiconductor laser by the region not near the facet acquiring a protective layer and the adhesion-reducing layer then being applied. After removal of the protective layer (e.g., dielectric), the adhesion-reducing layer is formed only near the facet. The adhesion-reducing layer can also be applied over the whole area, the adhesion-reducing layer being protected in the region near the facet and being etched away again in the region remote from the facet. After removal of the protective layer (e.g., dielectric layer) the adhesion-reducing layer is formed only near the facet.

The adhesion-reducing layer can also be applied in a targeted manner in the facet region of the two facets (coupling-out facet and rear-side facet), as described above.

The adhesion-reducing layer can also be applied over the whole area or irregularly partially, by the use of the above methods without structuring near the facet. Detachment of the protective layer 11, i.e., of the passivation in the facet region is carried out solely by the mechanical loads during the fracture of the laser facet.

A further example of a semiconductor laser 1 can be substantially like the semiconductor laser 1 in FIG. 1, but the active zone 4 is arranged in the strip 3. In this example, the narrow strip 3 is worked from the semiconductor layers of the main body 2 by a dry etch, for example, wherein the active zone 4 was additionally severed as well. Depending on the chosen structure, the active zone 4 can be arranged partly or completely, in the strip 3. A pn junction of the semiconducting layers is thus arranged in the strip 3. An optical mode 5 in the form of an oval is in the region of the active zone 4, which generates the light radiation. Formation of the optical mode 5 of the light radiation depends on the optical guiding of the light radiation. The light radiation generated by the active zone 4 is guided by corresponding light guiding layers along the longitudinal direction 6 of the strip 3 in the laser diode. Mirror layers are provided at opposite end faces, the facets, which mirror layers result in a reflection of the light radiation, wherein a mirror layer is at least partly transmissive to couple out the light generated by the active zone 4 from the semiconductor laser.

The large jump in refractive index at the side surface of the strip 3 with respect to the cavity 15 is advantageous efficient guidance of the light radiation generated, i.e., for formation of a narrowly delimited optical mode 5. In this arrangement, it is advantageous if the cavity 15 is arranged at least partly at the same level as the active zone 4. Preferably, the cavity 15 overlaps an entire side surface of the zone 4. The larger the natural overlap of the side surface of the zone 4, the better the guidance of the optical mode 5 on account of the high jump in refractive index at side surfaces 13, 14 of the strip 3. The side surfaces 13, 14 of the strip 3 and the first and second surfaces 9, 10 of the main body 2 are covered by a protective layer 11 constituting a dielectric passivation layer.

A cavity 15 is in each case formed between the protective layer 11 and a side surface 13, 14 of the strip 3 and/or a surface 9, 10 of the main body 2. In the example illustrated, in the corner region 16 arranged between the side surface 13, 14 of the strip 3 and the corresponding surface 9, 10 of the main body, the cavity 15 adjoins both the side surface 13, 14 and the adjoining surface 9, 10 of the main body 2. Depending on the chosen structure, the cavity 15 can also adjoin only the first or second surface of the main body 9, 10 or the first and/or the second side surface 13, 14 of the strip 3. The cavity 15 can also be provided only in sections along one or along two longitudinal sides of the strip 3.

Furthermore, the cavity 15 can also be formed by a protective layer 11 having a plurality of cavities, in particular which is porous and/or fissured. Any type of material cutout in the corner region 16 results in an improvement in the guidance of the light radiation, in particular in a delimited optical mode 5 arranged in the strip 3. The less material of the protective layer 11 is provided on the side surfaces 13, 14 and in the corner region 16, the smaller the refractive index and the larger the actual jump—perceived by the light radiation—in the refractive index adjoining the side surface 13, 14 of the strip 3 or the surfaces 9, 10 of the main body 2.

Greater lateral light wave guiding is achieved as a result of formation of the cavity 15 laterally with respect to the active zone 4. This results in an improved performance, in particular a reduced threshold current and an increased aging stability. Furthermore, multimode operation is possible even in a narrower strip 3. Furthermore, the reduced optical loading of the mirror layers (facets) of the first or second end face 7, 8 occurs. In addition, an increased gain is achieved for a defined width of the strip 3.

In a further example, the cavity 15 does not reach as far as the top side of the strip 3, but rather ends below the top side of the strip in a manner spaced apart by the thickness of the protective layer 11. In this example, the protective layer 11 is led as far as the side surface 13, 14 of the strip 3. The cavity 15 is thus closed off laterally by the protective layer 11. On the first and/or second end face 7, 8, the cavity 15 is closed by dielectric mirror layers. Depending on the chosen structure, the cavity 15 can also have other forms, in particular the forms that have been explained with reference to FIGS. 2 to 4, 17 and 18.

Although our lasers have been more specifically illustrated and described in detail by preferred examples, nevertheless this disclosure is not restricted by the examples disclosed and other variations can be derived therefrom by those skilled in the art, without departing from the scope of protection of the appended claims.

The invention claimed is:

1. A method of producing a semiconductor laser comprising an active zone that generates light radiation and a main body comprising:
   providing a strip having a narrower width on the main body,
   providing side surfaces of the strip with an electrically insulating protective layer,
   forming a cavity between a side surface of the strip and the protective layer, and
   applying an electrically conductive layer to the top side of the strip, wherein only a top side of the strip is covered with a first sacrificial layer, the first sacrificial layer and side surfaces of the strip are provided with the electrically insulating protective layer, the first sacrificial layer and the protective layer have different coefficients of thermal expansion which differ by a factor of 2, during a subsequent heating process, on account of different coefficients of thermal expansion, a cavity forms between a side surface of the strip and the protective layer, the protective layer and the first sacrificial layer are removed from the top side of the strip, and the electrically conductive layer is subsequently applied on the top side of the strip.

2. The method as claimed in claim 1, wherein the active zone is arranged at least partly or completely in the strip or in the main body.

3. The method as claimed in claim 1, wherein the cavity is arranged in a manner adjoining a corner region between a top side of the main body and a side surface of the strip.

4. The method as claimed in claim 1, wherein the cavity extends over an entire side length of the strip.

5. The method as claimed in claim 1, wherein the cavity extends over an entire height of the side surface of the strip, the protective layer is at a lateral distance from the side surface of the strip, and a gap between the protective layer and the strip is covered by the electrical contact.

6. The method as claimed in claim 1, wherein in a corner region between a side surface of the strip and a surface of the main body a cutout is introduced into the surface of the main body, and the cutout extends along the length of the strip.

7. The method as claimed in claim 1, wherein in a corner region between a side surface of the strip and a surface of the main body a cutout is introduced into the surface of the main body, the cutout extends along the length of the strip, and the cutout has a depth of 2 nm to 100 nm, and is produced by etching.

8. The method as claimed in claim 1, wherein the cavity has a height of 5% to 100% of the height of the side surface of the strip.

9. The method as claimed in claim 1, wherein the cavity has a width of 2 nm to 500 nm.

10. The method as claimed in claim 1, wherein the cavity varies in terms of width and/or in terms of height along the strip.

11. The method as claimed in claim 1, wherein a cavity is provided on both side surfaces of the strip and the cavities are substantially identical.

* * * * *